United States Patent
Jeon et al.

(10) Patent No.: US 9,674,958 B2
(45) Date of Patent: Jun. 6, 2017

(54) PRINTED CIRCUIT BOARDS AND SEMICONDUCTOR PACKAGES

(71) Applicant: Samsung Electronics Co., Ltd., Suwon-si, Gyeonggi-do (KR)

(72) Inventors: Sang-hun Jeon, Suwon-si (KR); Ho-jin Chun, Seoul (KR); Hyun-seok Cha, Osan-si (KR); Jae-hoon Heo, Suwon-si (KR); Young-deok Kim, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 252 days.

(21) Appl. No.: 14/596,770

(22) Filed: Jan. 14, 2015

(65) Prior Publication Data

US 2015/0357275 A1 Dec. 10, 2015

(30) Foreign Application Priority Data

Jun. 5, 2014 (KR) .................. 10-2014-0068580

(51) Int. Cl.
| | |
|---|---|
| *H05K 1/00* | (2006.01) |
| *H05K 1/18* | (2006.01) |
| *H05K 7/00* | (2006.01) |
| *G11C 5/06* | (2006.01) |
| *H01L 23/00* | (2006.01) |
| *H01L 25/18* | (2006.01) |
| *H05K 1/02* | (2006.01) |
| *H05K 3/46* | (2006.01) |
| *H01L 23/538* | (2006.01) |

(52) U.S. Cl.
CPC ............ *H05K 1/181* (2013.01); *G11C 5/063* (2013.01); *H05K 1/0286* (2013.01); *H01L 23/538* (2013.01); *H01L 24/16* (2013.01); *H01L 25/18* (2013.01); *H01L 2224/16145* (2013.01); *H01L 2224/16225* (2013.01); *H05K 1/0268* (2013.01); *H05K 3/4694* (2013.01); *H05K 2201/09127* (2013.01); *H05K 2201/09972* (2013.01)

(58) Field of Classification Search
USPC .................................. 361/748, 761
See application file for complete search history.

(56) References Cited

U.S. PATENT DOCUMENTS

| | | | |
|---|---|---|---|
| 6,954,929 | B2 | 10/2005 | Erickson et al. |
| 7,005,735 | B2 | 2/2006 | Park et al. |

(Continued)

FOREIGN PATENT DOCUMENTS

| | | |
|---|---|---|
| JP | 2007-058561 | 3/2007 |
| JP | 2009-276857 | 11/2009 |

(Continued)

*Primary Examiner* — Andargie M Aychillhum
(74) *Attorney, Agent, or Firm* — Ward and Smith, P.A.

(57) ABSTRACT

A printed circuit board includes an in-line PCB region comprising an input/output control region including a first conductive line, and a main PCB region coupled to the in-line PCB region and comprising a semiconductor chip and an input/output signal generation region including a second conductive line. The input/output signal generation region is configured to detect whether or not the first and second conductive lines are electrically connected and to provide an input/output control signal to the semiconductor chip in response to determining whether or not the first and second conductive lines are electrically connected.

12 Claims, 11 Drawing Sheets

(56) References Cited

U.S. PATENT DOCUMENTS

| | | | |
|---|---|---|---|
| 7,734,798 B2 | 6/2010 | Yamamoto | |
| 8,472,199 B2 | 6/2013 | Kim | |
| 8,860,452 B2 | 10/2014 | Lee | |
| 2009/0267711 A1* | 10/2009 | Kawabata | H01P 1/227 333/238 |
| 2012/0153982 A1* | 6/2012 | Lee | G01R 31/31908 324/756.03 |

FOREIGN PATENT DOCUMENTS

| | | |
|---|---|---|
| KR | 1019970016599 | 4/1997 |
| KR | 100145848 B1 | 5/1998 |
| KR | 1020040072807 A | 8/2004 |
| KR | 1020060096737 A | 9/2006 |
| KR | 100771785 B1 | 10/2007 |

\* cited by examiner

PRINTED CIRCUIT BOARDS AND SEMICONDUCTOR PACKAGES

CROSS-REFERENCE TO RELATED APPLICATION AND CLAIM OF PRIORITY

This application claims the benefit of Korean Patent Application No. 10-2014-0068580, filed on Jun. 5, 2014, in the Korean Intellectual Property Office, the disclosure of which is incorporated herein in its entirety by reference.

BACKGROUND

The inventive concept relates to printed circuit boards, semiconductor packages, and methods of manufacturing semiconductor packages, and more particularly, to printed circuit boards, semiconductor packages, and methods of manufacturing semiconductor packages that increase manufacturing efficiency.

A printed circuit board on which a semiconductor device is formed may include a single printed circuit board and a serially arranged printed circuit board. A serially arranged printed circuit board refers to a printed circuit board on which a plurality of semiconductor devices are formed. In manufacturing a semiconductor package, a surface mounting process is performed to affix at least one semiconductor device to a printed circuit board and a test operation and/or a program downloading operation may be performed with respect to the at least one semiconductor device formed on the printed circuit board.

In the manufacturing of the semiconductor package, it is important to simplify the manufacturing process. It is also important to reduce cost and time taken to produce the semiconductor package.

SUMMARY

The inventive concept provides a printed circuit board which is capable of increasing efficiency of manufacturing a semiconductor package, a semiconductor package, and a method of manufacturing the semiconductor package.

A printed circuit board according to some embodiments includes an in-line PCB region comprising an input/output control region including a first conductive line, and a main PCB region coupled to the in-line PCB region and comprising a semiconductor chip and an input/output signal generation region including a second conductive line. The input/output signal generation region is configured to detect whether or not the first and second conductive lines are electrically connected and to provide an input/output control signal to the semiconductor chip in response to determining whether or not the first and second conductive lines are electrically connected.

The input/output control signal may be a general purpose input/output (GPIO) signal.

The second conductive line may be connected to a first end of the first conductive line, and the main PCB region may include a third conductive line that is connected to a second end of the first conductive line.

One of a source voltage and a ground voltage may be connected to the second conductive line and another of the source voltage and the ground voltage may be connected to the third conductive line.

The main PCB region may further include a resistor connected the second conductive line or the third conductive line.

The input/output control signal may have a first state before the main PCB region is separated from the printed circuit board and a second state after the main PCB region is separated from the printed circuit board.

The main PCB region may further include a memory controller, and the input/output control signal may be provided to the memory controller.

The main PCB region may include a memory device and the input/output control signal may be provided to the memory device.

A first type of program may be provided to the semiconductor chip in response to the input/output control signal having a first state, and a second type of program may be provided to the semiconductor chip in response to the input/output control signal having a second state.

A semiconductor package according to some embodiments includes a main printed circuit board, a semiconductor chip on the main printed circuit board, and an input/output control signal generation unit on the main printed circuit board that transmits an input/output control signal to the semiconductor chip. The first input/output control signal generation unit includes a first conductive line and a second conductive line for transmitting the first input/output control signal, and the first conductive line and the second conductive line are electrically separated from each other in the main printed circuit board.

The semiconductor package may further include a second input/output control signal generation unit on the main printed circuit board that transmits a second input/output control signal to the semiconductor chip. The second input/output control signal generation unit includes a third conductive line and a fourth conductive line for transmitting the second input/output control signal, and the third conductive line and the fourth conductive line are electrically separated from each other in the main printed circuit board.

The first conductive line may connect a source voltage to the semiconductor chip.

The second conductive line may be connected to a ground voltage and may be electrically separated from the semiconductor chip, and when the first and second conductive lines are electrically connected with each other, the ground voltage may be connected to the semiconductor chip instead of the source voltage.

The third conductive line may connect a second ground voltage to the semiconductor chip.

The fourth conductive line may be connected to a second source voltage and may be electrically separated from the semiconductor chip, and when the third and fourth conductive lines are electrically connected with each other, the second source voltage may be connected to the semiconductor chip instead of the second ground voltage.

The first conductive line may be connected to a source voltage via a resistor and the second conductive line may be directly connected to a ground voltage.

The semiconductor package may further include a program transmission region including a conductive line for transmitting a program from the outside the semiconductor package to the semiconductor chip.

A printed circuit board according to further embodiments includes an in-line PCB region and a main PCB region coupled to the in-line PCB region and including a semiconductor chip and an input/output signal generation region. The input/output signal generation region is configured to transmit a first input/output control signal to the semiconductor chip when the main PCB region is attached to the in-line PCB region and to transmit a second input/output control signal to the semiconductor chip when the main PCB region is separated from the in-line PCB region.

The semiconductor chip may be configured to store a first type of program data in response to the first input/output control signal and to store a second type of program data in response to the second input/output control signal.

The input/output signal generation unit may include a conductive line that is configured to be cut when the main PCB region is separated from the in-line PCB region, and the input/output control signal may be generated based on whether or not the conductive line has been cut.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
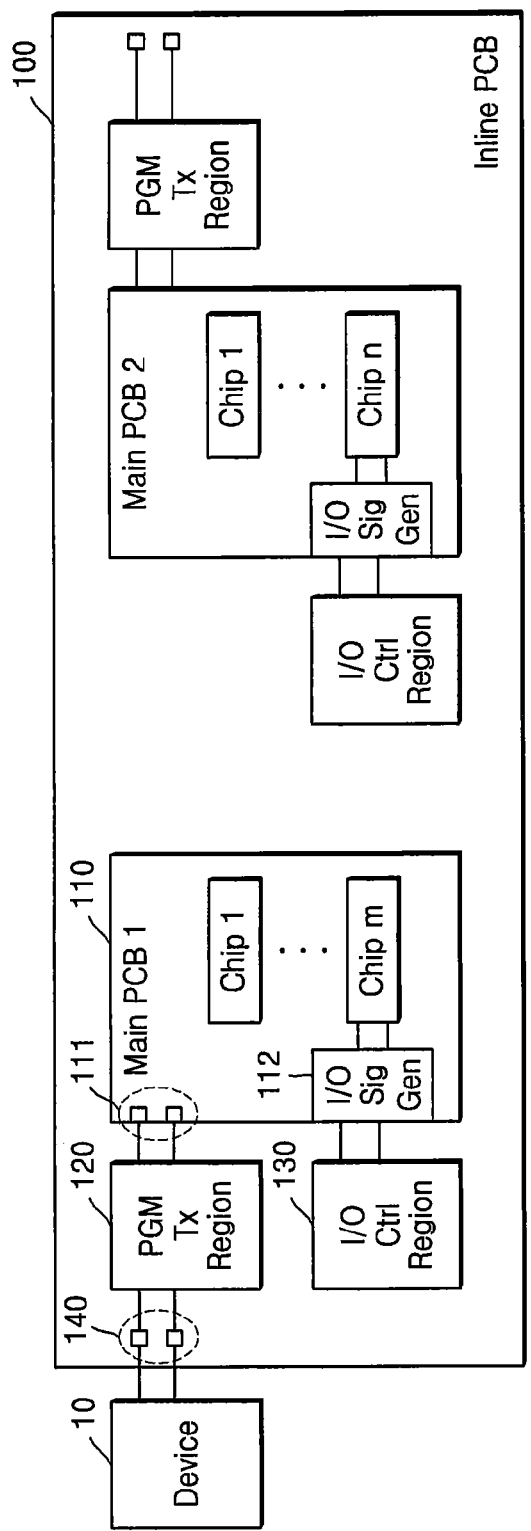
FIG. 1 is a block diagram of a printed circuit board and a semiconductor package according to an exemplary embodiment of the inventive concept.

The inventive concept now will be described more fully hereinafter with reference to the accompanying drawings, in which elements of the invention are shown. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art. In the drawings, the same reference numerals denote the same elements and the thicknesses of layers and regions and the sizes of components may be exaggerated for clarity.

Meanwhile, the terminology used herein is for the purpose of describing particular embodiments only and is not intended to be limiting of exemplary embodiments. As used herein, the singular forms "a," "an," and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, the term "and/or" includes any and all combinations of one or more of the associated listed items.

FIG. 1 is a block diagram of a printed circuit board 100 and a semiconductor package according to an exemplary embodiment of the inventive concept.

As illustrated in FIG. 1, the printed circuit board 100 provides a substrate body that may include a plurality of PCB regions on which semiconductor package may be formed and/or mounted. The PCB regions on which semiconductor packages may be formed/mounted may be identified as main PCB regions 110. In the embodiments of FIG. 1, the printed circuit board 100 is a serially arranged printed circuit board that includes a plurality of main PCB regions 110. However, the main PCB regions 110 can be arranged in many different configurations. In addition, a printed circuit board 100 may include only a single main PCB region 110 in some cases. An exemplary embodiment of the inventive concept will be described with reference to one of the plurality of main PCB regions 110 included in the printed circuit board 100.

During the manufacturing process, the main PCB regions 110 on a printed circuit board 100 may be separated from the printed circuit board 100. For example, the main PCB regions 110 may be physically cut out of the printed circuit board 100. According to some embodiments, a main PCB region 110 may be tested and/or configured before the main PCB region 110 is separated from the printed circuit board 100, i.e., while the printed circuit board 100 is still intact. In order to facilitate such on-board testing and configuration, ancillary circuits/devices may be provided on the printed circuit board 100 along with the main PCB regions 110. The ancillary circuits/devices, which are provided in an inline PCB region of the printed circuit board 100, may include, but are not limited to, one or more program transmission regions 120 and input/output control regions 130, as discussed in more detail below. The ancillary circuits/devices are configured to communicate with the main PCB regions 110 by means of conductive lines formed on or in the printed circuit board 100.

At least one semiconductor chip Chip 1 to Chip m may be mounted in the main PCB region 110. Also, the main PCB region 110 may include at least one port unit 111 for receiving at least one type of data (for example, program or configuration data). For example, the main PCB region 110 may include a first port unit 111 for receiving program data, such as a boot code, and firmware. The first port unit 111 may include at least one terminal, and the program/configuration data may be provided to the main PCB region 110 via the first port unit 111. A serial communication protocol may be used for transmission of program data between an external device 10 and the main PCB region 110. For example, any one of an universal asynchronous receiver/transmitter (UART), inter-integrated circuit (I2C), and/or serial peripheral interconnect (SPI) protocol may be used, and in addition to these, other types of protocols may also be used.

The main PCB region 110 may include an input/output control signal generation unit 112 for generating an input/output control signal. The input/output control signal may include a general purpose input output signal (GPIO). The input/output control signal generation unit 112 may include a plurality of conductive lines (not shown), and the plurality of conductive lines may be connected to a source voltage (e.g., Vcc) or a ground voltage GND. The input/output control signal may have a value corresponding to a voltage level, and the input/output control signal generated by the input/output control signal generation unit 112 may be provided to the at least one semiconductor chip Chip 1 to Chip m. FIG. 1 illustrates an example in which the input/output control signal is provided to the $m^{th}$ semiconductor chip Chip m. However, the input/output signal may be provided to one or more of the other semiconductor chips as well.

As noted above, regions of the printed circuit board 100 outside the main PCB regions 110 may be defined as an in-line PCB region, and the in-line PCB region may include ancillary circuits/devices, such as a program transmission region 120 and an input/output control region 130. The program transmission region 120 may be connected to the external device 10 via at least one terminal included in a second port unit 140 in the printed circuit board 100, and the external device 10, which is a user device, may be a program provision device and/or a test device. Also, although FIG. 1 illustrates an embodiment in which one input/output control region 130 is provided for each main PCB region 110, the input/output control signal generated by the input/output control signal generation unit 112 may comprise a signal group including a plurality of signals. In this case, two or more input/output control regions may be formed in the in-line PCB region for each main PCB region.

The program transmission region 120 may include at least one conductive line for transmitting program/configuration data to the main PCB region 110. The program transmission region 120 may be connected to the first port unit 111 of the main PCB region 110 and may provide the program/configuration data, such as the boot code and the firmware, which is received from the external device 10, to one or more of the semiconductor chips Chip 1 to Chip m of the main PCB region 110.

The input/output control region 130 may control states of the input/output control signal (for example, the GPIO signal) that is generated by the input/output control signal generation unit 112 and provided to the semiconductor chip Chip 1 to Chip m of the main PCB region 110. The input/output control region 130 may include at least one conductive line (not shown), and the at least one conductive line included in the input/output control region 130 may be electrically connected to the at least one conductive line included in the input/output control signal generation unit 112 of the main PCB region 110. At least one input/output control signal may be provided to the semiconductor chip Chip 1 to Chip m of the main PCB region 110. For example, an input/output control signal having a first value or a second value under a control of the input/output control region 130 may be provided to the semiconductor chip Chip 1 to Chip m.

In a process of manufacturing the semiconductor package, the main PCB region 110 may be separated from the printed circuit board 100 by a cutting process. Before the cutting process is performed, the at least one conductive line included in the input/output control signal generation unit 112 of the main PCB region 110 may be electrically connected with the at least one conductive line included in the input/output control region 130. After the cutting process is performed, the at least one conductive line included in the input/output control signal generation unit 112 may be electrically separated from the at least one conductive line included in the input/output control region 130.

The input/output control signal, which may include a control signal group, may set an operation mode of the semiconductor chip Chip 1 to Chip m. For example, as illustrated in FIG. 1, the operation mode of the semiconductor chip Chip 1 to Chip m may be set by one input/output control signal. Alternatively, the operation mode of the semiconductor chip Chip m may be set according to signal states of two or more input/output control signals. According to the present exemplary embodiment, before a cutting process is performed to separate the main PCB region 110, an input/output control signal indicating a first operation mode may be provided to the semiconductor chip Chip 1 to Chip m. After the cutting process with respect to the main PCB region 110 is performed, an input/output control signal indicating a second operation mode may be provided to the semiconductor chip Chip 1 $m$. The first and second operation modes may be defined in various ways. For example, in the first operation mode, the semiconductor chip Chip 1 to Chip m may receive a program from the external device 10 and store the program. In the second operation mode, the semiconductor chip Chip 1 to Chip m may perform operations (for example, a booting operation) for a normal operation mode. Alternatively, the semiconductor chip Chip 1 to Chip m may receive a first program (for example, a boot code) from the external device 10 and store the first program, in the first operation mode, and may receive a second program (for example, a main program such as firmware) which is a different type of program from the first program from the external device 10 and store the second program, in the second operation mode.

According to the embodiment of FIG. 1, there may be no need to receive the input/output control signal for commanding the operation mode from the external device 10 via an additional terminal after separation of the main PCB region 110. Different input/output control signals having different information may be provided to the semiconductor chip Chip 1 to Chip m before and after the cutting operation. Accordingly, in the manufacturing of the semiconductor package, a process of manufacturing may be simplified, and thus, the productivity may be increased. Also, since the information of the input/output control signal may be easily changed by using the input/output control region 130, a selective program downloading operation may be easily performed. In the above-described exemplary embodiment, an example is described in which different programs are downloaded according to the operation mode. However, exemplary embodiments of the inventive concept are not limited thereto. For example, various types of test operations may be performed in the process of manufacturing the semiconductor package, and different test operations may be performed according to the information of the input/output control signal, different configuration data may be loaded into the main PCB region 110, etc.

Also, in the case of a serially arranged PCB structure in general, a program download or test operation may be possible after the serially arranged PCB structure has been divided into a single PCB. However, since the program/configuration data downloading and/or test operation may be performed in the serially arranged PCB structure, cost effectiveness and time efficiency of the manufacturing may be improved.

Figure 2:
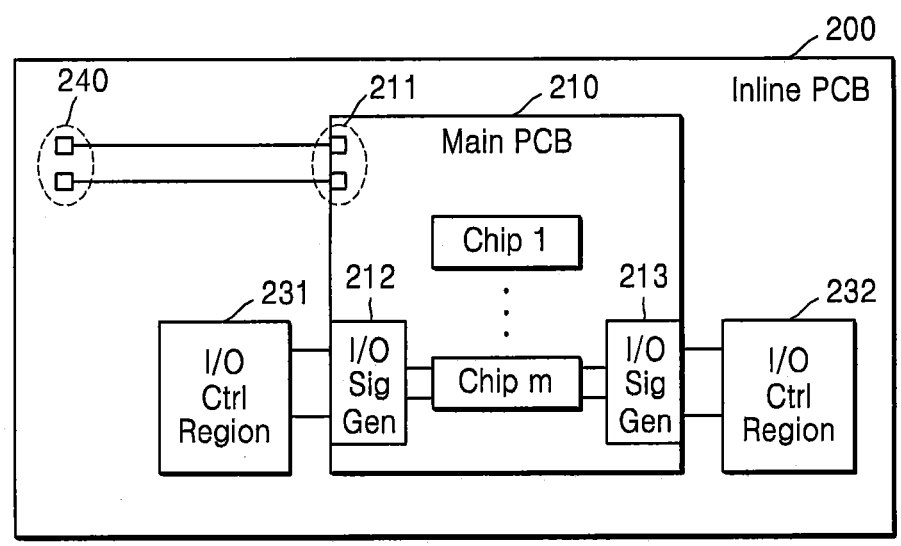
FIG. 2 is a block diagram of a printed circuit board and a semiconductor package according to another exemplary embodiment of the inventive concept.

FIG. 2 is a block diagram of a printed circuit board 200 and a semiconductor package according to another exemplary embodiment of the inventive concept. FIG. 2 illustrates a case in which a printed circuit board includes a singlel main PCB region.

As illustrated in FIG. 2, the printed circuit board 200 may include a main PCB region 210 in which a semiconductor package is formed. At least one semiconductor chip Chip 1 to Chip m may be mounted in the main PCB region 210. Also, the main PCB region 210 may include a first port unit 211 for receiving program/configuration data and one or more input/output control signal generation units 212 and 213 for generating an input/output control signal, such as a GPIO signal. The input/output control signal generation units 212 and 213 each may include at least one conductive line (not shown) for providing the input/output control signal to the at least one semiconductor chip Chip 1 to Chip m.

Also, as described above, regions of the printed circuit board 200 other than the main PCB region 210 may be referred to as the in-line PCB region. The in-line PCB region may include one or more input/output control regions. For example, a first input/output control region 231 may be electrically connected with a first input/output control signal generation unit 212 and a second input/output control region 232 may be electrically connected with a second input/output control signal generation unit 213.

The first input/output control signal generation unit 212 provides a first input/output control signal having a first or second value that is determined in response to whether the first input/output control signal generation unit 212 is electrically connected to the at least one semiconductor chip Chip 1 to Chip m through the first input/output control region 231. Also, the second input/output control signal generation unit 213 provides a second input/output control signal having a first or second value that is determined in response to whether the second input/output control signal generation unit 213 is electrically connected to the at least one semiconductor chip Chip 1 to Chip m through the second input/output control region 232. An operation mode of the semiconductor chip Chip 1 to Chip m may be selected in response to a combination of the first and second input/output control signals. For example, a first operation mode or a second operation mode may be set in response to the combination of the first and second input/output control signals.

Moreover, as illustrated in FIG. 2, the in-line PCB region may further include a second port unit 240 for receiving program/configuration data. As described above, the external device 10 may provide at least one type of program/configuration data to the main PCB region 210 via the second port unit 240.

The main PCB region 210 may be separated from the printed circuit board 200 by a cutting process. The first and second input/output control signals that are provided to the main PCB region 210 may convey different information depending on whether the main PCB region 210 is separated from the printed circuit board 200 or not. For example, before the main PCB region 210 is separated from the printed circuit board 200, the first and second input/output control signals may convey first information to the main PCB region 210, whereas after the main PCB region 210 is separated from the printed circuit board 200, the first and second input/output control signals may convey second information (or a second combination) to the main PCB region 210.

According to an exemplary embodiment, before the main PCB region 210 is separated from the printed circuit board 200, the at least one conductive line included in the first and second input/output control signal generation units 212 and 213 of fhe main PCB region 210 may be electrically connected with conductive lines included in the first and second input/output control regions 231 and 232. Accordingly, each of the first and second input/output control signal generation units 212 and 213 may generate the input/output control signal having the first or second value. For example, when the first input/output control signal generation unit 212 generates the first input/output control signal having the first value, the second input/output control signal generation unit 213 may generate the second input/output control signal having the second value.

However, after the main PCB region 210 is separated from the printed circuit board 200, the at least one conductive line included in the first and second input/output control signal generation units 212 and 213 may be electrically separated from the conductive lines included in the first and second input/output control regions 231 and 232. In this case, first and second input/output control signals may be generated that are different from the first and second input/output control signals that were generated before the main PCB region 210 was separated from the printed circuit board 200. For example, after separation, the first input/output control signal generation unit 212 may generate the first input/output control signal having the second value, and the second input/output control signal generation unit 213 may generate the second input/output control signal having the first value.

An operation for downloading program/data information to the at least one semiconductor chip Chip 1 to Chip m may include a plurality of operation modes. For example, as in the above-described exemplary embodiment, for the program downloading operation, a plurality of operation modes for downloading different types of programs may be defined. For example, in a first mode, a boot code may be downloaded in the at least one semiconductor chip Chip 1 to Chip m, and in a second mode, a main program, such as firmware, may be downloaded in the at least one semiconductor chip Chip 1 to Chip m. The boot code or the firmware may be stored in different regions of the at least one semiconductor chip Chip 1 to Chip m. When the first and second input/output control signals have the first information, the semiconductor chip Chip 1 to Chip m may operate in the first mode in response to the first and second input/output control signals. When the first and second input/output control signals have the second information, the semiconductor chip Chip 1 to Chip m may operate in the second mode in response to the first and second input/output control signals.

Figure 3:
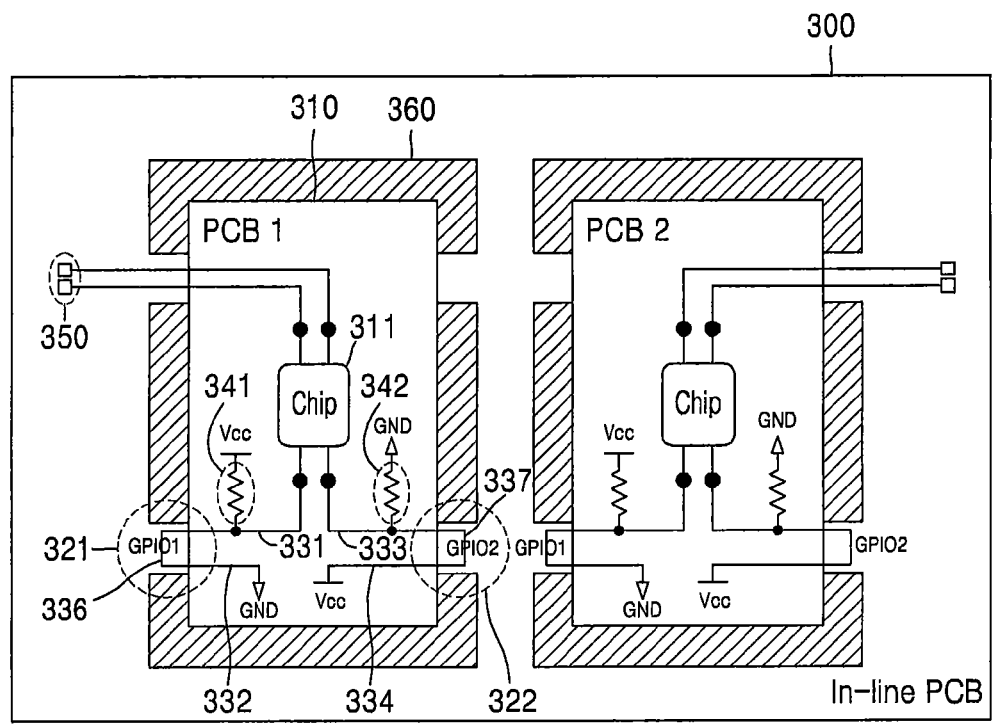
FIG. 3 is a circuit diagram illustrating an example of the printed circuit board of FIG. 1.
Figure 4:
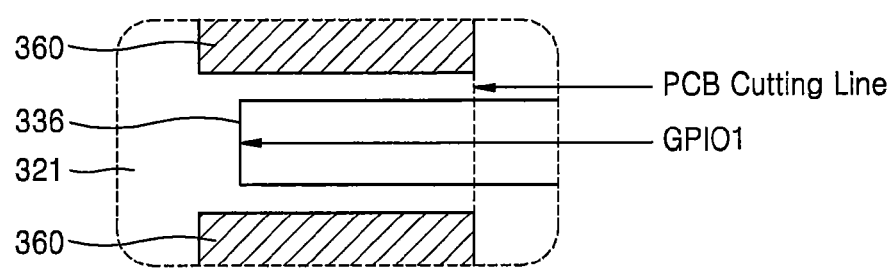
FIG. 4 is an enlarged view of an input/output control region of FIG. 3.

FIG. 3 is a circuit diagram illustrating an example of the printed circuit board of FIG. 1, and FIG. 4 is an enlarged view of the input/output control regions of FIG. 3.

As illustrated in FIG. 3, a printed circuit board 300 may include at least one main PCB region 310 in which a semiconductor package is formed. For example, the printed circuit board 300 may include first and second main PCB regions PCB 1 and PCB 2. Also, the printed circuit board 300 may include an in-line PCB region in addition to the main PCB regions PCB 1 and PCB 2. The inline PCB region may include a port unit 350 for receiving program/configuration data, such as boot code or firmware, from an external device. Also, the in-line PCB region may include at least one input/output control region for controlling states of input/output control signals provided in the first and second main PCB regions PCB 1 and PCB 2. For example, first and second input/output control regions 321 and 322 may be formed in the in-line PCB region.

A structure and operation of the printed circuit board 300 illustrated in FIG. 3 will be described with specific reference to the first main PCB region 310.

At least one semiconductor chip 311 may be mounted in the first main PCB region 310 by a surface mounting process (SMT process). A program may be provided to the semiconductor chip 311 via a plurality of conductive lines arranged in the first main PCB region 310. Also, at least one input/output control signal (for example, a first input/output control signal GPIO 1 and a second input/output control signal GPIO 2) may be provided to the semiconductor chip 311.

The first main PCB region 310 may include a plurality of conductive lines for transmitting the first and second input/output control signals to the semiconductor chip 311. For example, the first main PCB region 310 may include a first conductive line 331 and a second conductive line 332 which are related to a transmission of the first input/output control signal GPIO 1), and a third conductive line 333 and a fourth conductive line 334 which are related to a transmission of the second input/output control signal GPIO 2.

Each of the first through fourth conductive lines 331 through 334 may be connected to a predetermined voltage within the main PCB region 310. In more detail, each of the first through fourth conductive lines 331 through 334 may be physically connected to a specific level of a voltage. However, at least one selected from the first through fourth conductive lines 331 through 334 may be electrically connected to a voltage having different values based on whether or not the first main PCB region 310 has been separated from the printed circuit board 300.

For example, the first conductive line 331 and the fourth conductive line 334 may be physically connected to a source voltage Vcc and the second conductive line 332 and the third conductive line 333 may be physically connected to a ground voltage GND. Also, at least some of the first through fourth conductive lines 331 through 334 may be connected to a resistor, respectively. For example, the first conductive line 331 may be physically connected to the source voltage Vcc via a first resistor 341. Also, the third conductive line 333 may be physically connected to the ground voltage GND via a second resistor 342. The conductive lines and the resistors illustrated in FIG. 3 may be components of the input/output control signal generation units 212 and 213 of the earlier-described exemplary embodiment. For example, the first conductive line 331, the second conductive line 332, and the first resistance 341 may form the first input/output control signal generation unit 212, and the third conductive line 333, the fourth conductive line 334, and the second resistance 342 may form the second input/output control signal generation unit 213.

Each of the first and second input/output control regions 321 and 322 may include a conductive line 336, 337 that is outside the main PCB region 310. For example, a first end of the conductive line 336 included in the first input/output control region 321 may be connected to the first conductive line 331 in the first main PCB region 310, and a second end of the conductive line 336 included in the first input/output control region 321 may be connected to the second conductive line 332 in the first main PCB region 310. Also, similarly, the conductive line 337 included in the second input/output control region 322 may be connected to the third conductive line 333 and the fourth conductive line 334 in the first main PCB region 310. That is, the line for transmitting the input/output control signal to the semiconductor chip 311 has a structure of passing through the conductive lines 331 through 334 in the first main PCB region 310 and a conductive line 336, 337 in the in-line PCB region. Although illustrated as separate lines, the conductive lines 331, 332, 336 in the first input/output control region 321 may be configured as a single conductive line that extends from the first main PCB region 310, to the inline PCB region, and back to the first main PCB region 310.

Before the cutting process is performed, the first conductive line 331 and the second conductive line 332 are electrically connected with each other by the conductive line 336 included in the first input/output control region 321. Accordingly, the first conductive line 331 is electrically connected to the ground voltage GND which is physically connected to the second conductive line 332. Also, the third conductive line 333 and the fourth conductive line 334 are electrically connected with each other by the conductive line 337 included in the second input/output control region 322. Accordingly, the third conductive line 333 is electrically connected to the source voltage Vcc which is physically connected to the fourth conductive line 334. Since the first conductive line 331 is connected to the first resistance 341, a voltage value corresponding to the ground voltage GND connected to the second conductive line 332 may be provided to the semiconductor chip 311 as the first input/output control signal GPIO 1. Also, since the third conductive line 333 is connected to the second resistance 342, a voltage value corresponding to the source voltage Vcc which is connected to the fourth conductive line 334 may be provided to the semiconductor chip 311 as the second input/output control signal GPIO 2. Accordingly, the first and second input/output control signals GPIO 1 and GPIO 2 indicating an operation mode of the semiconductor chip 311 have first information in which the first and second input/output control signals GPIO 1 and GPIO 2 respectively have a value "0" and a value "1," and the semiconductor chip 311 may operate in a first mode in response to the first and second input/output control signals GPIO 1 and GPIO 2.

On the contrary, after the cutting process is performed (or after the main PCB region 310 has been otherwise separated from the printed circuit board 300), the first conductive line 331 and the second conductive line 332 are electrically separated from each other. Also, after the cutting process is performed, the third conductive line 333 and the fourth conductive line 334 are electrically separated from each other. Accordingly, since only the first conductive line 331 is connected to the semiconductor chip 311, a voltage value corresponding to the source voltage Vcc may be provided to the semiconductor chip 311 as the first input/output control signal GPIO 1. Similarly, since only the third conductive line 333 is connected to the semiconductor chip 311, a voltage value corresponding to the ground voltage GND may be provided to the semiconductor chip 311 as the second input/output control signal GPIO 2. Accordingly, the first and second input/output control signals GPIO 1 and GPIO 2 indicating the operation mode of the semiconductor chip 311 have second information in which the first and second input/output control signals GPIO 1 and GPIO 2 respectively have a value "1" and a value "0", and the semiconductor chip 311 may operate in a second mode in response to the first and second input/output control signals GPIO 1 and GPIO 2.

Although FIG. 3 illustrates that one semiconductor chip 311 is mounted in the first main PCB region 310, two or more semiconductor chips may be mounted in the first main PCB region 310. For example, semiconductor chips, such as a controller, a NAND and/or NOR flash memory device, and the like, may be mounted, and various kinds of program/configuration data, such as a boot code, firmware, and the like, may be downloaded in the controller, the NAND and/or flash memory device, and the like. Before the first main PCB region 310 is separated from the printed circuit board 300, any one kind of program (for example, the boot code) may be stored in the semiconductor chip 311 based on the the first and second input/output control signals GPIO 1 and GPIO 2 having first states. After the first main PCB region 310 is separated from the printed circuit board 300, another kind of program (for example, a main program such as the firmware) may be stored in the semiconductor chip 311 based on the first and second input/output control signals GPIO 1 and GPIO 2 having second states.

As illustrated in FIG. 3, at least one cutting region 360 may be formed in the printed circuit board 100 by a previous cutting process. As shown in an enlarged view of the input/output control regions 321 and 322 of FIG. 3 of FIG. 4, a PCB cutting line may be defined with respect to a portion of an edge of the first main PCB region 310, and the cutting process may be performed with respect to only the portion of the edge of the first main PCB region 310 to separate the first main PCB region 310 from the printed circuit board 100.

According to the embodiments described above, when a semiconductor package is manufactured, a manufacturing process for downloading a program to a semiconductor chip in the package may be simplified, and thus, the productivity of the manufacturing process may be increased. Also, the PCB in-line region for selective downloading of programs may be realized more simply, and thus, the cost for the realization may be reduced.

Figure 5:
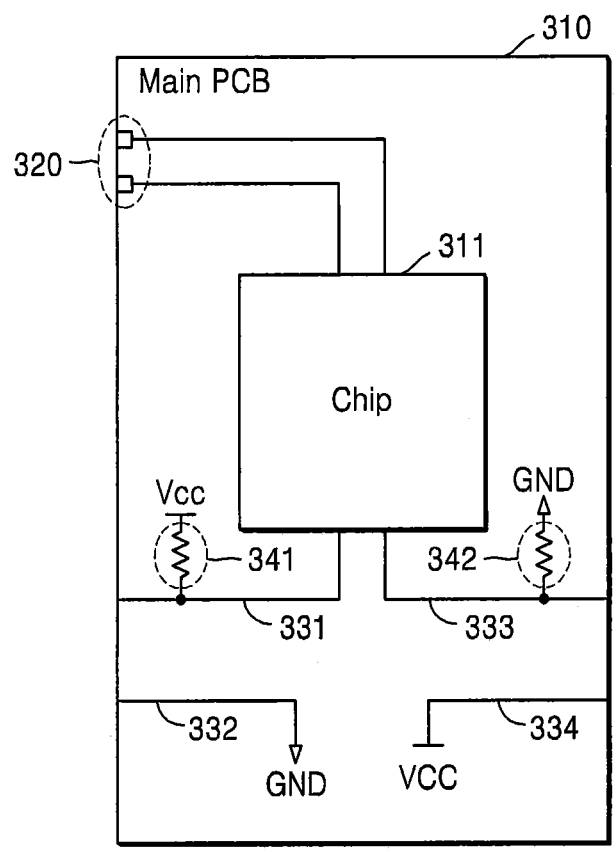
FIG. 5 is a circuit diagram illustrating a first main PCB region that is separated from the printed circuit board of FIG. 3.

FIG. 5 is a circuit diagram illustrating a first main PCB region 310 that has been separated from the printed circuit board 300 of FIG. 3. As illustrated in FIG. 5, the first main PCB region 310 includes the semiconductor chip 311 to which program/data information may be downloaded. Before the first main PCB region 310 is separated from the printed circuit board 300, the first and second input/output control signals GPIO 1 and GPIO 2 having first information are provided to the semiconductor chip 311, directing the semiconductor chip to download a first type of program. After the first main PCB region 310 is separated from the printed circuit board 300, however, the first conductive line 331 and the second conductive line 332 are electrically separated from each other and the third conductive line 333 and the fourth conductive line 334 are electrically separated from each other as illustrated in FIG. 5. Accordingly, the first and second input/output control signals GPIO 1 and GPIO 2 having second information are provided to the semiconductor chip 311, directing the semiconductor chip to download a second type of program. The second type of program may be provided to the semiconductor chip 311 from an external device via the port unit 320.

Figure 6:
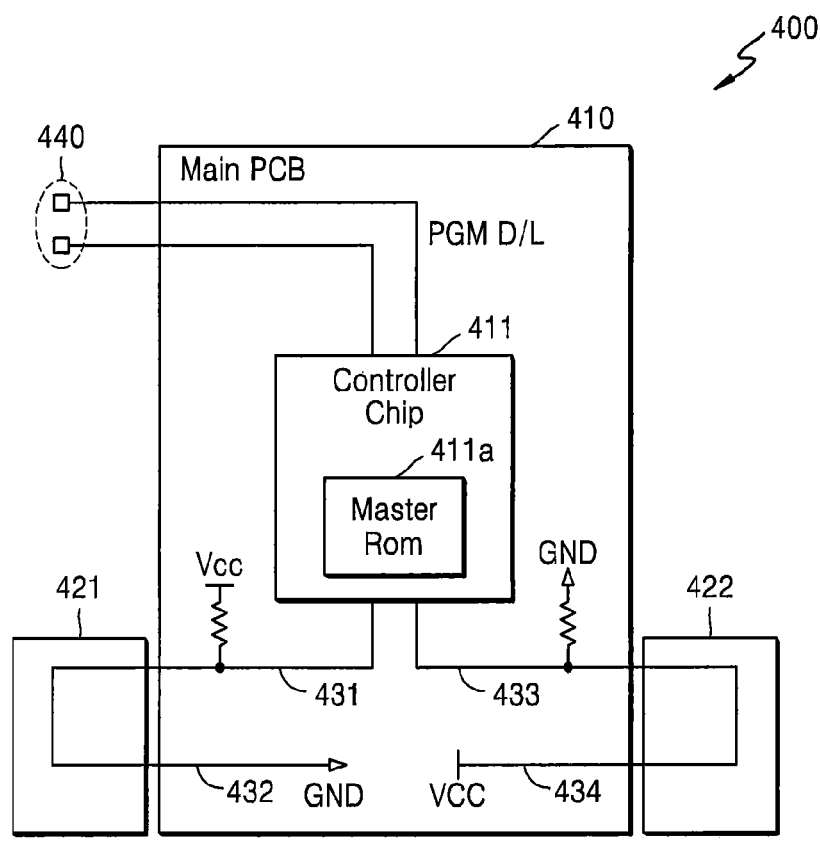
FIG. 6 is a block diagram of a printed circuit board and a semiconductor package according to another exemplary embodiment of the inventive concept.

FIG. 6 is a block diagram of a printed circuit board 400 and a semiconductor package according to another exemplary embodiment of the inventive concept. FIG. 6 illustrates an example in which a controller chip 411 is mounted in a main PCB region 410 of the printed circuit board 400. For convenience of explanation, with respect to an in-line PCB region except the main PCB region 410, FIG. 6 illustrates only a port unit 430 for transmitting programs and input/output control regions 421 and 422 for controlling states of input/output control signals.

As illustrated in FIG. 6, the printed circuit board 400 may include the main PCB region 410 in which a semiconductor package is formed. At least one semiconductor chip is mounted in the main PCB region 410 by a surface mounting process. For example, the controller chip 411 for controlling a memory device or the like may be mounted in the main PCB region 410. Also, the controller chip 411 may include master ROM 411a that can store various information. Various programs/configuration data for operating the controller chip 411 may be stored in the master ROM 411a. For example, a boot code for managing a booting operation of a memory system may be stored in the master ROM 411a.

Programs/configuration data are received by the port unit 440 of the in-line PCB region, and the programs are downloaded to the controller chip 411 via conductive lines of the in-line PCB region and the main PCB region 410. In this case, since it is before the main PCB region 410 has been separated from the printed circuit board 400, a first conductive line 431 and a second conductive line 432 are electrically connected to each other via the first input/output control region 421, and accordingly, a voltage value corresponding to a ground voltage GND is provided to the controller chip 411 as a first input/output control signal. Also, a third conductive line 433 and a fourth conductive line 434 are electrically connected to each other via the second input/output control region 422, and accordingly, a voltage value corresponding to a source voltage Vcc is provided to the controller chip 411 as a second input/output control signal.

The controller chip 411 operates in a first mode in response to the first and second input/output control signals having first information (for example, a combination of "0" and "1"), and a first type of program is provided to the controller chip 411 by the port unit 440. The controller chip 411 may store the first type of program in a portion of the master ROM 411a while operating in the first mode.

After the main PCB region 410 has been separated from the printed circuit board 400, for example by a cutting operation, the first conductive line 431 and the second conductive line 432 are electrically separated from each other and the third conductive line 433 and the fourth conductive line 434 are electrically separated from each other. Accordingly, a voltage value corresponding to the source voltage Vcc is provided to the controller chip 411 via the first conductive line 431 as the first input/output control signal, and a voltage value corresponding to the ground voltage GND is provided to the controller chip 411 via the third conductive line 433 as the second input/output control signal. Accordingly, the controller chip 411 operates in a second mode in response to the first and second input/output control signals having second information (for example, a combination of "1" and "0"). A second type of program may then be provided to the controller chip 411 via the port unit 430. The controller chip 411 may store the second type of program in the other portion of the master ROM 411a while operating in the second mode.

According to another exemplary embodiment, before the main PCB region 410 is separated from the printed circuit board 400, as the first and second input/output control signals having the first information (for example, the combination of "0" and "1") are provided to the controller chip 411, the controller chip 411 may store a program from the outside in the master ROM 411a by operating in a program downloading mode. After the main PCB region 410 has been separated from the printed circuit board 400 as the first and second input/output control signals having the second information (for example, the combination of "1" and "0") are provided to the controller chip 411, the controller chip 411 may operate in a booting mode to control such that normal operations of the semiconductor package are performed.

Figure 7:
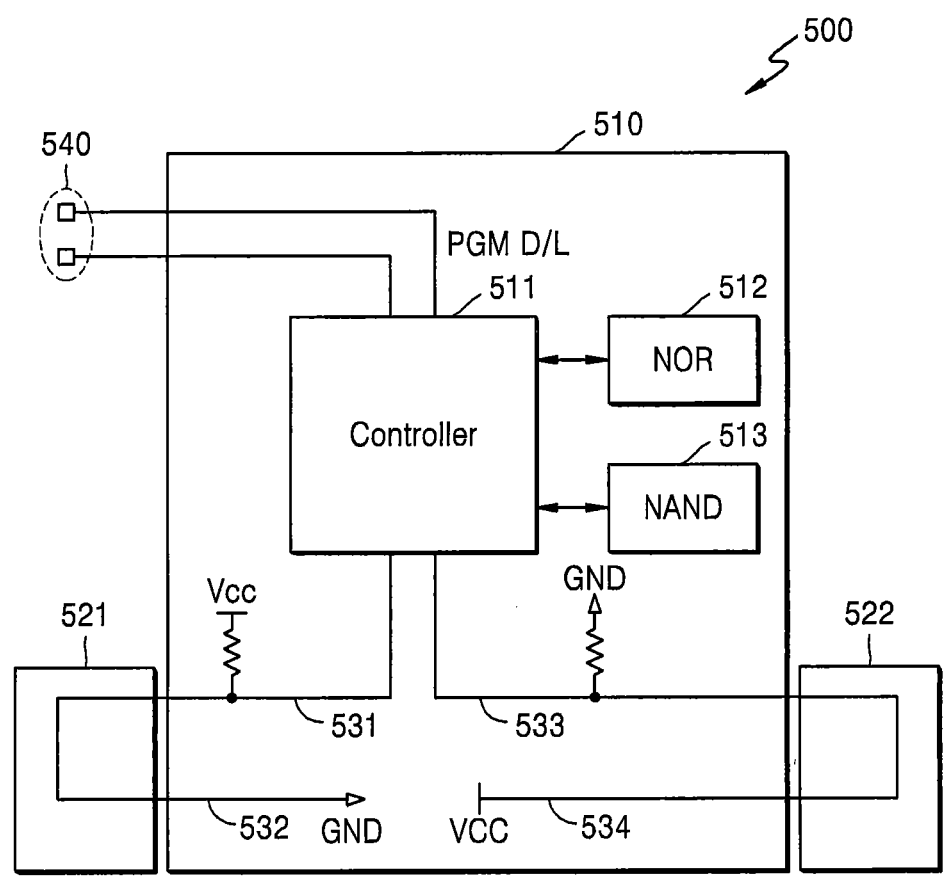
FIG. 7 is a block diagram of a printed circuit board and a semiconductor package according to another exemplary embodiment of the inventive concept.

FIG. 7 is a block diagram of a printed circuit board 500 and a semiconductor package according to another exemplary embodiment of the inventive concept. FIG. 7 illustrates an example in which a controller 511 and at least one memory are mounted in a main PCB region 510 of the printed circuit board 500. The controller 511 and the at least one memory may be realized in the same chip or may be realized as different chips. For convenience of explanation, with respect to an in-line PCB region except the main PCB region 510, FIG. 7 illustrates only a port unit 540 for transmitting program/configuration data and input/output control regions 521 and 522 for controlling states of input/output control signals.

As illustrated in FIG. 7, the printed circuit board 500 may include the main PCB region 510 in which a semiconductor package is formed. Also, the main PCB region 510 may include the controller 511 and at least one memory, such as NOR flash memory 512 and NAND flash memory 513. As described above, the controller 511, the NOR flash memory 512, and the NAND flash memory 513 may be realized in the same chip or each may be realized as one or more different chips. Also, the main PCB region 510 may include at least one conductive line for generating and transmitting input/output control signals. For example, first through fourth conductive lines 531 through 534 may be formed in the main PCB region 510.

Each of the input/output control regions 521 and 522 may include conductive lines, and depending on whether the main PCB region 510 has been separated from the printed circuit board 500, electrical connection states with respect to the first through fourth conductive lines 531 through 534 are controlled. Similarly with the above-described exemplary embodiment, before the main PCB region 510 is separated from the printed circuit board 500, as the first and second input/output control signals having first information (for example, a combination of "0" and "1") are provided to the controller 511, the controller 511 operates in a first mode. In the first mode, the controller 511 receives a first type of program (for example, a boot code) and stores the first type of program in any one memory. For example, the first type of program may be stored in the NOR flash memory 512 in the first mode.

After the main PCB region 510 has been separated from the printed circuit board 500, as the first and second input/output control signals having second information (for example, a combination of "1" and "0") are provided to the controller 511, the controller 511 operates in a second mode. In the second mode, the controller 511 may receive a second type of program (for example, a main program such as firmware) and store the second type of program in another memory. For example, the second type of program may be stored in the NAND flash memory 513 in the second mode.

According to another exemplary embodiment, a plurality of types of programs may be provided to the controller 511 in the first mode, and the controller 511 may store some of the programs in either the NOR flash memory 512 or the NAND flash memory 513. Then, the controller 511 may store others of the programs in the other memory according to the first mode.

When the controller 511 is mounted in the main PCB region 510 as the semiconductor package, at least one memory may be mounted in the main PCB region 510 along with the controller 511. When driving the semiconductor package, a storage device may be included in the controller 511 as in the above-described exemplary embodiment, and thus, a booting operation may be performed by using a boot code stored in the storage device. According to the present exemplary embodiment, at least one type of program may be stored in the NOR flash memory 512 and/or the NAND flash memory 513, and the booting operation may be performed by using the boot code stored in the memory (for example, the NOR flash memory 512). According to another exemplary embodiment, the boot code may be stored in the storage device of the controller 511, and in the driving of the semiconductor package, the boot code stored in the storage device of the controller 511 may be downloaded in any one memory (for example, the NOR flash memory 512).

Figure 8:
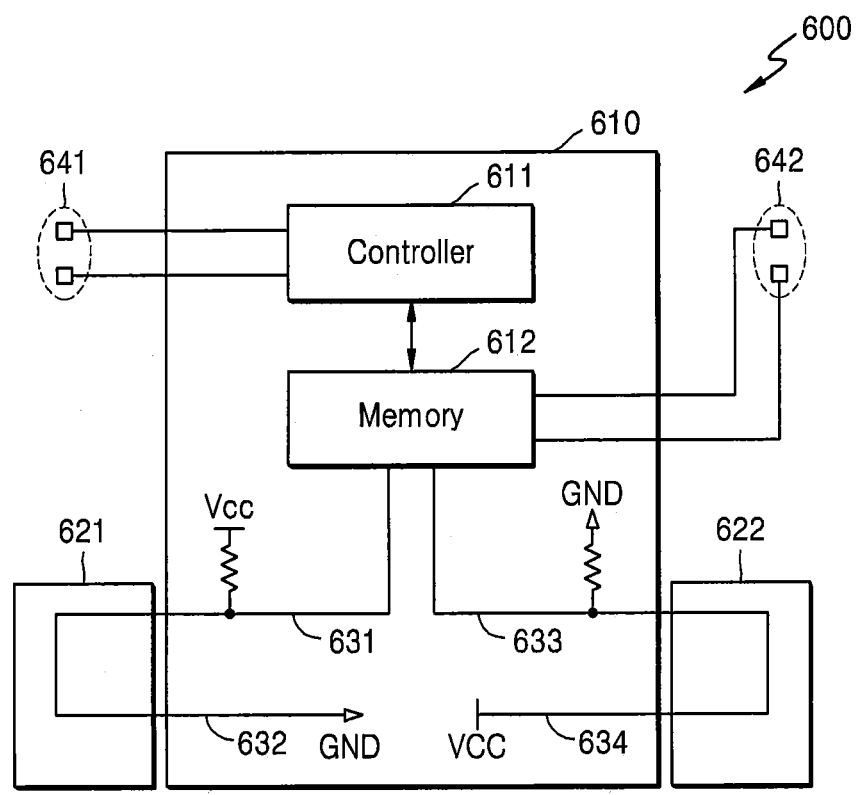
FIG. 8 is a block diagram of a printed circuit board and a semiconductor package according to another exemplary embodiment of the inventive concept.

FIG. 8 is a block diagram of a printed circuit board 600 and a semiconductor package according to another exemplary embodiment of the inventive concept. FIG. 8 illustrates an example in which a controller 611 and at least one memory 612 are mounted in a main PCB region 610 of the printed circuit board 600. As described above, the controller 611 and the memory 612 may be realized in the same chip or may be realized as different chips.

FIG. 8 illustrates an example in which a program is directly downloaded to the memory 612 mounted in the printed circuit board 600. For example, the printed circuit board 600 may include the main PCB region 610 and the main PCB region 610 may include the controller 611 and at least one memory 612. Also, the main PCB region 610 may include at least one conductive line for generating and transmitting input/output control signals. For example, the main PCB region 610 may include first through fourth conductive lines 631 through 634. Also, an in-line PCB region may include a first port unit 641 and a second port unit 642 as at least one port unit for receiving programs. Also, the in-line PCB region may include first and second input/output control regions 621 and 622 for controlling states of first and second input/output control signals.

At least one type of program may be transmitted via each of the first port unit 641 and the second port unit 642. For example, as the first port unit 641 is electrically connected to the controller 611, a first program via the first port unit 641 may be provided to the controller 611. The first program may be stored in the controller 611 or in a portion of the memory 612. Similarly, as the second port unit 642 is electrically connected to the memory 612, a second program via the second port unit 642 may be stored in the memory 612. Before the main PCB region 610 is separated from the printed circuit board 600, a downloading mode in which various types of programs are downloaded in the controller 611 and the memory 612, may be performed. For example, a boot code may be received via the first port unit 641 and the boot code may be stored in the controller 611. Also, a main program such as firmware may be received via the second port unit 642 and the main program may be stored in the memory 612.

Before the main PCB region 610 is separated from the printed circuit board 600, the first and second input/output control signals having first information (for example, a combination of "0" and "1") by the first and second input/output control regions 621 and 622, may be provided to the memory 612. In a first mode, the memory 612 may perform operations of receiving programs provided from the outside and storing the programs.

After the main PCB region 610 is separated from the printed circuit board 600, the first and second input/output control signals having second information (for example, a combination of "1" and "0") may be provided to the memory 612 by the first conductive line 631 and the third conductive line 633. In a second mode, the memory 612 may operate in a mode for normal operations, and accordingly, information stored in the memory 612 may be read or information may be stored in the memory 612.

Figure 9:
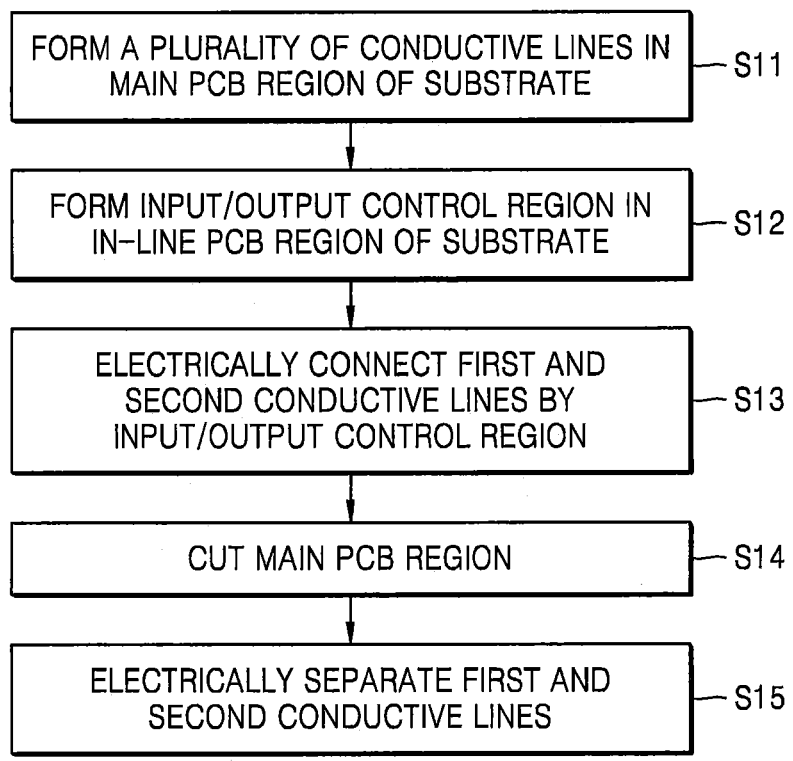
FIG. 9 is a flowchart illustrating a method of manufacturing a semiconductor package according to an exemplary embodiment of the inventive concept.

FIG. 9 is a flowchart illustrating a method of manufacturing a semiconductor package according to an exemplary embodiment of the inventive concept.

As illustrated in FIG. 9, various conductive lines are formed on a printed circuit board as a substrate body. The printed circuit board as the substrate body may include a main PCB region and an in-line PCB region. A plurality of conductive lines for generating and transmitting at least one input/output control signal may be formed in the main PCB region in operation S11. For example, when first and second input/output control signals are generated, first and second conductive lines which are related to a transmission of the first input/output control signal may be formed and third and fourth conductive lines which are related to a transmission of the second input/output control signal may be formed, as in the above-described exemplary embodiments.

Meanwhile, at least one input/output control region may be formed in the in-line PCB region in operation S12. The at least one input/output control region may include at least one conductive line. When the first and second input/output control signals are generated, first and second input/output control regions may be formed in the in-line PCB region. Before and after a cutting process is performed with respect to the main PCB region, connection states of the first through fourth conductive lines in the main PCB region may be controlled by the input/output control regions.

According to the present exemplary embodiment, to make a description with respect to the first and second conductive lines which are related to one input/output control signal, the first and second conductive lines are electrically connected to each other by the input/output control region, before the cutting process with respect to the main PCB region is performed, in operation S13. Accordingly, the input/output control signal having a first value (for example, a GPIO signal) is provided to a semiconductor chip in the main PCB region and the semiconductor chip may operate in a first mode in response to the input/output control signal.

Then, as the cutting process with respect to the main PCB region is performed, the main PCB region is separated in operation S14, and accordingly, the first and second conductive lines are electrically separated from each other in operation S15. As the main PCB region is separated, an input/output control signal having a second value is provided to the semiconductor chip in the main PCB region and the semiconductor chip operates in a second mode in response to the input/output control signal.

According to the input/output control signal, a selective downloading operation with respect to a plurality types of programs may be performed. For example, types of programs to be downloaded may be selected according to a state of the input/output control signal, and a first type of program (for example, a boot code) may be downloaded in a first mode and a second type of program (for example, a main program, such as firmware) may be downloaded in a second mode. Also, according to the state of the input/output control signal, a device which the programs are to be downloaded in may be selected.

Figure 10:
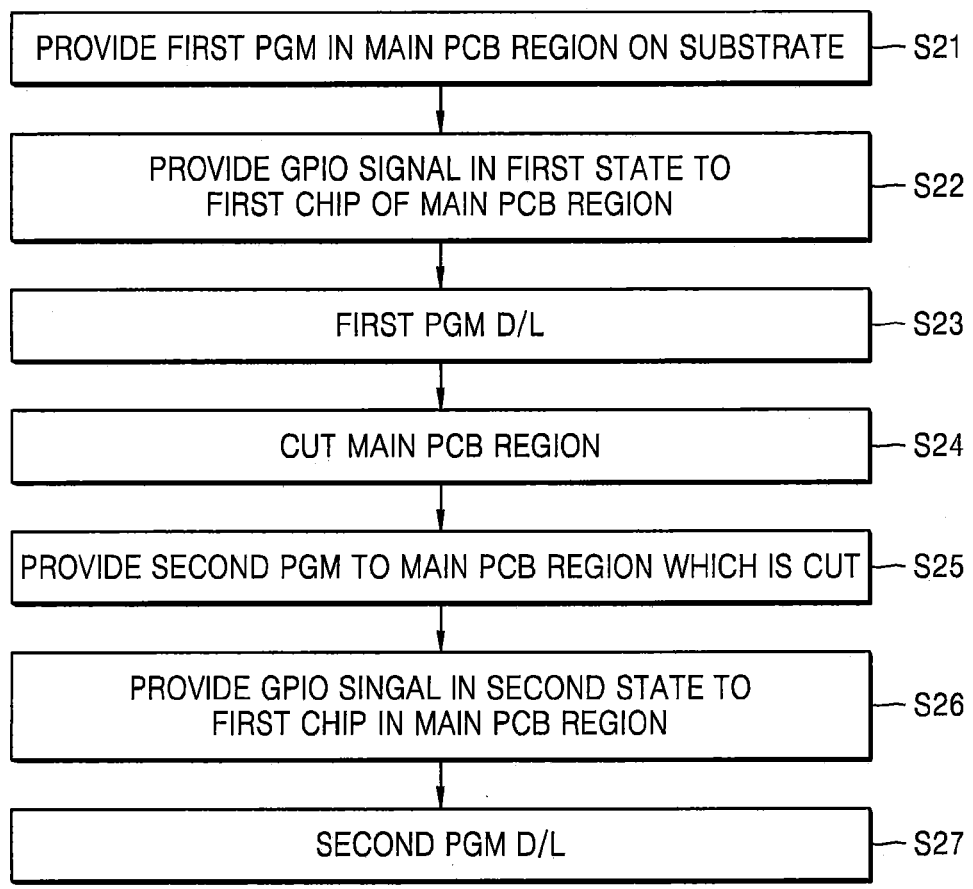
FIG. 10 is a flowchart illustrating a method of manufacturing a semiconductor package according to another exemplary embodiment of the inventive concept.

FIG. 10 is a flowchart illustrating a method of manufacturing a semiconductor package according to another exemplary embodiment of the inventive concept.

As illustrated in FIG. 10, a first program is provided to a main PCB region of a printed circuit board as a substrate body, in operation S21. Also, as in the above-described exemplary embodiments, since it is before the main PCB region is separated from the printed circuit board, an input/output control signal having a first state (for example, a GPIO signal) may be provided to a semiconductor chip (a first chip) in the main PCB region in operation S22, and accordingly, the semiconductor chip in the main PCB region may download the first program according to a first mode in operation S23.

A cutting process is then performed with respect to the main PCB region in operation S24, and connection states of a plurality of conductive lines which are related to a generation and a transmission of input/output control signals, the conductive lines being formed in the main PCB region, change. In operation S25, a second program is provided to the separated main PCB region, and an input/output control signal having a second state may be provided to the semiconductor chip in the main PCB region, in operation S26. Accordingly, the semiconductor chip of the main PCB region may download the second program according to a second mode, in operation S27.

Figure 11:
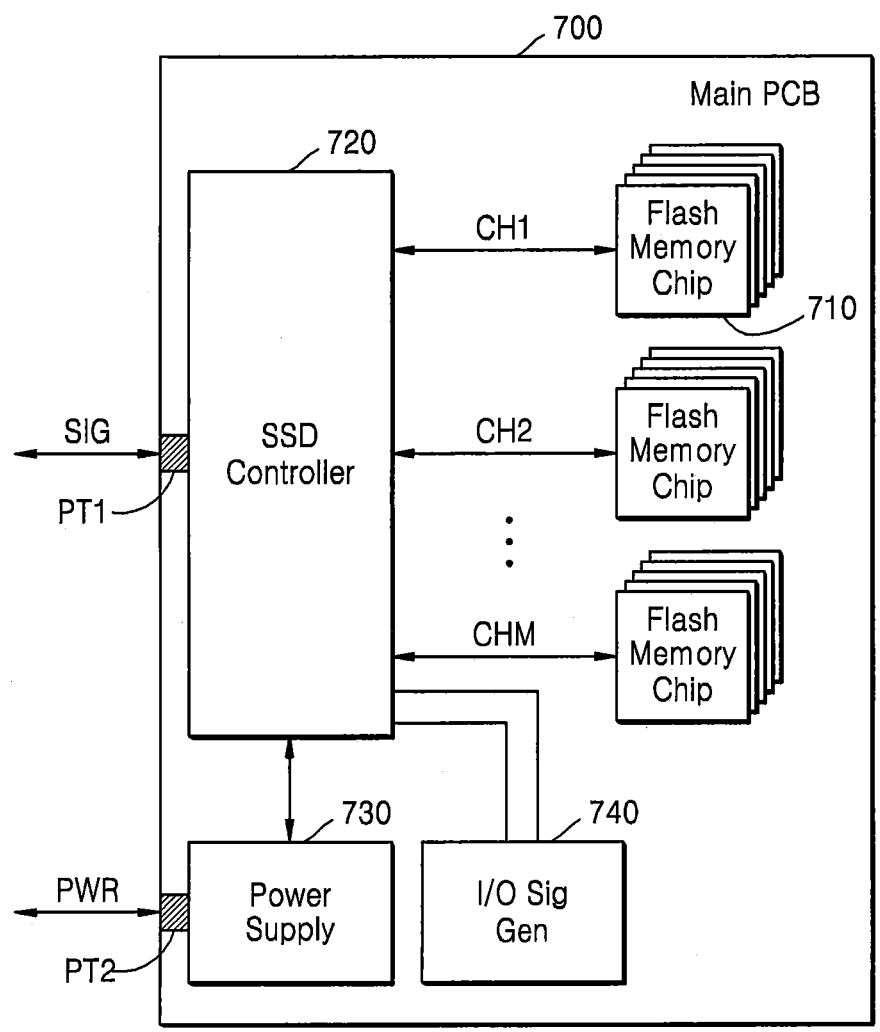
FIG. 11 is a block diagram of a solid state drive (SSD) in which semiconductor packages according to exemplary embodiments of the inventive concept are applied.

FIG. 11 is a block diagram of a solid state drive (SSD) 700 implementing a semiconductor package according to an exemplary embodiment of the inventive concept.

As illustrated in FIG. 11, the SSD 700 which may be manufactured as the semiconductor package may include a plurality of memory chips 710, an SSD controller 720, and a power supply unit 730. The plurality of memory chips 710 may include non-volatile memory chips. For example, the plurality of memory chips 710 may include NAND and/or NOR flash memory as described above. Also, according to the present exemplary embodiment, the SSD 700 may further include an input/output control signal generation unit 740 which generates input/output control signals. Before the SSD 700 is separated from a substrate body, an input/output control signal in a first state may be provided to the SSD controller 720, and after the SSD 700 is separated from the substrate body, an input/output control signal in a second state may be provided to the SSD controller 720.

The SSD controller 720 controls flash memory chips 710 in response to a signal SIG received from a host via a first port PT1. The SSD controller 720 may be connected to the flash memory chips 710 via a plurality of channels CH1 through CHM. The SSD 700 may further include an auxiliary power device 730 to receive power PWR from the host via a second port PT2. However, it is not limited thereto, and the SSD 700 may receive power from an external device other than the host. The SSD 700 may output a result SIG of processing a request of the host via the first port PT1.

Also, when a downloading mode of a program such as a boot code or firmware is performed, the SSD controller 720 may set an operation mode thereof according to an input/output control signal from the input/output control signal generation unit 740. For example, the SSD controller 720 may store the boot code in the SSD controller 720 or may store the boot code in some of the plurality of memory chips 710, in a first mode. Also, the SSD controller 720 may store the main program such as firmware in the rest of the plurality of memory chips 710 in a second mode.

Figure 12:
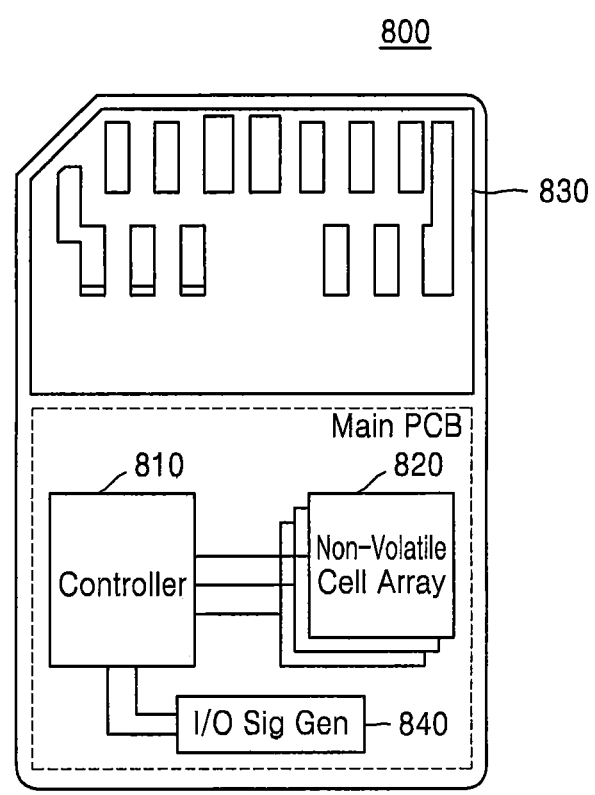
FIG. 12 is a block diagram of a memory card in which semiconductor packages according to exemplary embodiments of the inventive concept are applied.

FIG. 12 is a block diagram illustrating a memory card 800 implementing a semiconductor package according to an exemplary embodiment of the inventive concept. The memory card 800 may be a portable storage device which may be used by being connected to electronic devices, such as mobile devices or desk-top computers.

As illustrated in FIG. 12, the memory card 800 may include a main PCB region and a port region 830. Also, the main PCB region may include a memory controller 810, a non-volatile memory device 820, and an input/output control signal generation unit 840.

The memory card 800 may communicate with an external host (not shown) via the port region 830 and the memory controller 810 may control the non-volatile memory device 820. The memory controller 810 may perform control functions by reading programs from ROM (not shown) which stores the programs.

Also, as in the above-described exemplary embodiments, an input/output control signal is generated by the input/output control signal generation unit 840 included in the main PCB region, and the input/output control signal may be provided to the memory controller 810. In a process of manufacturing the main PCB region, before and after the main PCB region is separated from a substrate body, input/output control signals in different states may be generated. According to the states of the input/output control signals, different types of programs may be stored. As in the above-described exemplary embodiments, a boot code may be provided to the memory controller 810 or may be stored in a portion of the non-volatile memory device 820 under a control of the memory controller 810. Also, a main program such as firmware may be stored in other portions of the non-volatile memory device 820.

While the inventive concept has been particularly shown and described with reference to exemplary embodiments thereof, it will be understood that various changes in form and details may be made herein without departing from the spirit and scope of the following claims.

What is claimed is:

1. A printed circuit board (PCB) comprising:
   an in-line PCB region comprising an input/output control region including a first conductive line; and
   a main PCB region coupled to the in-line PCB region and comprising a semiconductor chip and an input/output signal generation region including a second conductive line;
   wherein the in-line PCB region of the printed circuit board and the main PCB region of the printed circuit board are separated by a PCB cutting line at which the main PCB region is separable from the in-line PCB region; and
   wherein the input/output signal generation region is configured to detect whether or not the first and second conductive lines are electrically connected and to provide an input/output control signal to the semiconductor chip in response to determining whether or not the first and second conductive lines are electrically connected,
   wherein the second conductive line is connected between a first end of the first conductive line and the semiconductor chip, and wherein the main PCB region further comprises a third conductive line that is connected to a second end of the first conductive line, a source voltage is connected to the second conductive line and a ground voltage is connected to the third conductive line, and wherein the ground voltage is provided to the semiconductor chip through the first and second conductive lines before the main PCB region is separated from the printed circuit board and the source voltage is provided to the semiconductor chip after the main PCB region is separated from the printed circuit board.

2. The printed circuit board of claim 1, wherein the input/output control signal is a general purpose input/output (GPIO) signal.

3. The printed circuit board of claim 1, wherein the main PCB region further comprises a resistor connected to the second conductive line or the third conductive line.

4. The printed circuit board of claim 1, wherein the input/output control signal has a first state before the main PCB region is separated from the printed circuit board and the input/output control signal has a second state after the main PCB region is separated from the printed circuit board.

5. The printed circuit board of claim 1, wherein the main PCB region further comprises a memory controller, and the input/output control signal is provided to the memory controller.

6. The printed circuit board of claim 1, wherein the main PCB region comprises a memory device and the input/output control signal is provided to the memory device.

7. The printed circuit board of claim 1, wherein a first type of program is provided to the semiconductor chip in response to the input/output control signal having a first state and a second type of program is provided to the semiconductor chip in response to the input/output control signal having a second state.

8. A semiconductor package comprising:
   a main printed circuit board;
   a semiconductor chip on the main printed circuit board; and
   an input/output control signal generation unit on the main printed circuit board that transmits an input/output control signal to the semiconductor chip, wherein the input/output control signal generation unit comprises a first input/output control signal generation unit and the input/output control signal comprises a first input/output control signal, the semiconductor package further comprising a second input/output control signal generation unit on the main printed circuit board that transmits a second input/output control signal to the semiconductor chip,
   wherein the second input/output control signal generation unit comprises a third conductive line and a fourth conductive line for transmitting the second input/output control signal wherein the third conductive line and the fourth conductive line are electrically separated from each other in the main printed circuit board,
   wherein the first conductive line is coupled to a source voltage and to the semiconductor chip,
   wherein the second conductive line is coupled to a ground voltage and the source voltage comprises a first source voltage, wherein the fourth conductive line is connected to a second source voltage and is electrically separated from the semiconductor chip, and
   wherein when the third and fourth conductive lines are electrically connected with each other, the second source voltage is connected to the semiconductor chip instead of the second ground voltage.

9. The semiconductor package of claim 8, wherein the ground voltage is electrically separated from the semiconductor chip, and
   wherein when the first and second conductive lines are electrically connected with each other, the ground voltage is connected to the semiconductor chip instead of the source voltage.

10. The semiconductor package of claim 9, wherein the ground voltage comprises a first ground voltage, and wherein the third conductive line connects a second ground voltage to the semiconductor chip.

11. The semiconductor package of claim 8, wherein the first conductive line is connected to a source voltage via a resistor and the second conductive line is directly connected to a ground voltage.

12. The semiconductor package of claim 8, further comprising a program transmission region comprising a conductive line for transmitting a program from the outside the semiconductor package to the semiconductor chip.

* * * * *